(12) United States Patent
Freidhof

(10) Patent No.: US 11,422,159 B2
(45) Date of Patent: Aug. 23, 2022

(54) MEASUREMENT DEVICE WITH ARBITRARY WAVEFORM GENERATOR AND TRIGGER UNIT

(71) Applicant: Rohde & Schwarz GmbH & Co. KG, Munich (DE)

(72) Inventor: Markus Freidhof, Kirchseeon (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 1386 days.

(21) Appl. No.: 15/599,207

(22) Filed: May 18, 2017

(65) Prior Publication Data

US 2018/0335470 A1 Nov. 22, 2018

(51) Int. Cl.
*G01R 31/28* (2006.01)
*G01R 13/02* (2006.01)

(52) U.S. Cl.
CPC ...... *G01R 13/0254* (2013.01); *G01R 13/0263* (2013.01)

(58) Field of Classification Search
CPC .... G01R 13/00; G01R 13/02; G01R 13/0218; G01R 13/0254; G01R 13/0263; G01R 13/28; G06F 5/00
See application file for complete search history.

(56) References Cited

U.S. PATENT DOCUMENTS

| | | | |
|---|---|---|---|
| 5,184,062 A * | 2/1993 | Ladwig | G01R 13/32 324/121 R |
| 7,072,781 B1 * | 7/2006 | Gershon | G01R 31/31908 324/426 |
| 10,197,600 B2 * | 2/2019 | Holcomb | G01R 13/20 |
| 2007/0236230 A1 * | 10/2007 | Tanbakuchi | G01R 31/2841 324/650 |
| 2007/0290909 A1 * | 12/2007 | Jungerman | G06F 5/00 341/144 |
| 2009/0027135 A1 * | 1/2009 | Kurosawa | G06F 1/0342 332/100 |
| 2009/0189615 A1 * | 7/2009 | Kinsel | H02H 1/0015 324/537 |
| 2009/0204357 A1 * | 8/2009 | Kurosawa | G06F 1/0342 702/124 |
| 2010/0164555 A1 * | 7/2010 | Takahashi | G01R 31/2841 327/106 |
| 2012/0268101 A1 * | 10/2012 | Weller | G01R 13/0254 324/76.11 |
| 2015/0369849 A1 * | 12/2015 | Betts | G01R 27/32 324/638 |
| 2017/0307678 A1 * | 10/2017 | Diegmann | G01R 13/0218 |

* cited by examiner

*Primary Examiner* — Huy Q Phan
*Assistant Examiner* — David B Frederiksen
(74) *Attorney, Agent, or Firm* — Christensen O'Connor Johnson Kindness PLLC

(57) ABSTRACT

A measurement device comprising a housing, a measurement channel, a trigger unit connected to the measurement channel, and an arbitrary waveform generator housed within the housing is disclosed. The measurement channel comprises an acquisition unit. The trigger unit is configured to detect a predetermined trigger event in a signal processed by the measurement channel. The trigger unit is configured to control the acquisition unit, and the trigger unit is configured to control the arbitrary waveform generator. Moreover, a measurement system and a method for operating a measurement device are disclosed.

17 Claims, 4 Drawing Sheets

MEASUREMENT DEVICE WITH ARBITRARY WAVEFORM GENERATOR AND TRIGGER UNIT

FIELD OF THE DISCLOSURE

Embodiments of the present disclosure relate generally to a measurement device, a measurement system as well as a method for operating a measurement device.

BACKGROUND

In some measurement applications, devices under test send out a first signal and wait for an appropriate response from another device (tag) before sending out a second signal. For example, this principle is very common for near field communication (NFC) devices. A NFC-reader sends out a first signal and waits for an appropriate response from a NFC tag. If the NFC reader receives the appropriate signal, it sends out the second signal. Generally, this principle takes place for radio-frequency identification (RFID).

Usually, in order to be able to test such devices, in particular NFC readers, the appropriate tag for the device under test is needed. However, it would be desirable to test such devices without the appropriate tag.

SUMMARY

Accordingly, there is a need for a measurement device, a measurement system and a method for operating the measurement device that is capable of measuring devices under test without the appropriate tag.

Embodiments of the present disclosure provide a measurement device that addresses this need, among others. The measurement device comprises a housing, a measurement channel, a trigger unit connected to the measurement channel, and an arbitrary waveform generator housed within the housing, the measurement channel comprising an acquisition unit, the trigger unit being configured to detect a predetermined trigger event in a signal processed by the measurement channel, the trigger unit being configured to control the acquisition unit, and the trigger unit being configured to control the arbitrary waveform generator. The signal processed is forwarded to the measurement device by a device under test being connected to the measurement device. Therefore, by choosing the condition for detecting the trigger event (trigger condition), the measurement device can be adapted to automatically generate an appropriate output signal via the integrated arbitrary waveform generator in response to an input signal received fulfilling the respective condition. This means that the appropriate output signal generated is a signal that the device under test awaits in response to the input signal. No additional signal generation device, such as an external function generator or arbitrary waveform generator, is needed for generating the output signal. Therefore, the additional costs for the signal generation device are saved. In addition, the measurement setups used can be arranged in a more compact way. Furthermore, the versatility of the measurement device is not impacted as an internal arbitrary waveform generator that is not connected to one of the outputs of the measurement device, in particular a trigger out output, that can be used for different purposes.

In an embodiment, the measurement channel also has an analog to digital converter. Thus, the signal processed can be digitized appropriately.

According to one aspect of the present disclosure, the trigger unit is configured to cause the arbitrary waveform generator to at least one of start generating an output signal and stop generating an output signal. The trigger unit causes a triggered start and/or stop of output signal generation. Therefore, the exact behaviour of the output signal over time can be adapted, in particular the phase information of the output signal generated.

According to another aspect, the trigger unit is configured to cause the arbitrary waveform generator to start generating the output signal with a delay. Due to the delay, precisely timed signals can be generated, in particular the start of signal generation can be precisely timed. This enables repeating the measurements in a comparable manner.

In one embodiment of the present disclosure, the trigger unit is configured to cause the arbitrary waveform generator to modify an output signal generated. Thereby the measurement device can respond to a series of input signals with signals each being appropriate for the respective current input signal. For instance, the device under test generating the different input signals awaits different signals as responses.

The trigger unit may be an analog trigger unit, the analog trigger unit being connected to an input of the measurement device. Therefore, the trigger unit is not restricted by a sampling rate and may furthermore have a low latency. Moreover, a cost-saving measurement device is provided.

In a further aspect, the trigger unit is a digital trigger unit, the digital trigger unit being configured to receive a digital representative of an input signal. The input signal may be digitized by the analog to digital converter. In this embodiment of the present disclosure, the trigger unit may be configured to detect complex trigger events hardly detectable with an analog trigger unit.

In a certain embodiment of the present disclosure, the measurement device further comprises a bus system, the trigger unit being configured to control the arbitrary waveform generator based on data contained within a bus signal. The bus signal may be decoded appropriately in order to obtain the data contained within the bus signal. Based on the data contained within a bus signal, trigger conditions that are complex and/or precise can be set, meaning that the trigger unit is able to detect complex and subtle trigger events, respectively.

The measurement device may further comprise a signal output allocated to the arbitrary waveform generator. Therefore signals generated by the arbitrary waveform generator can directly be output and for example transmitted to a device under test via the signal output wherein the device under test is connected to the measurement device, in particular at least its signal output.

According to an aspect of the present disclosure, the trigger unit is configured to discriminate between at least two different trigger events. For instance, different signals are processed wherein a certain trigger event is allocated to a respective signal. Further, the trigger unit may trigger on different signal portions differently by applying different trigger conditions relating to the different trigger events.

In another aspect, the trigger unit is configured to cause the arbitrary waveform generator to modify the output signal based on the trigger event detected. The trigger unit therefore can control the arbitrary waveform generator to generate an output signal appropriate for the specific input signal (portion) received, for example if a device under test is configured to transmit different input signals and to await the respective appropriate response signal.

In a certain embodiment of the present disclosure, the measurement device comprises an interface that is configured to set the trigger event. In particular, a condition for the trigger event to be detected may be adjustable by a user via the interface. In other words, the trigger condition is adjustable to a specific device under test and/or testing scenario.

The interface may be displayed on a display of the measurement device, for instance as a part of a graphical user interface. The display can be established by a touch-sensitive display such that an intuitive interface is provided.

The measurement device may be at least one of an oscilloscope and a spectrum analyzer. Therefore, measurement devices having trigger functions may comprise the integrated arbitrary waveform generator for triggering purposes ensuring that the versatility of these devices is not influenced compared to measurement devices that require to connect the arbitrary waveform generator to a trigger output of the respective device.

According to another aspect the trigger unit is configured to detect the predetermined trigger event and to control the arbitrary waveform generator in response to the trigger event detected. The trigger unit therefore can control the arbitrary waveform generator in direct response to the trigger event. Once the trigger event occurs, the arbitrary waveform generator is controlled directly.

Embodiments of the present disclosure also provide a measurement system. The measurement system comprises a device under test and a measurement device as described above, the device under test and the measurement device being connected with each other. The measurement device and the device under test may be connected to each other directly, for instance by connecting means being formed correspondingly. The measurement device and the device under test may be connected to each other via at least one of a probe and a transmission unit. The probe may be configured to receive electromagnetic waves generated by the device under test and to generate an input signal for the measurement device. The transmission device may be configured to receive an output signal via the signal output and to generate electromagnetic waves, wherein the device under test may be configured to receive the electromagnetic waves. Alternatively, the device under test and the measurement device are connected to each other via a line such as a cable.

In one aspect of the present disclosure, the device under test is configured to forward a signal to an input of the measurement device, the signal being processed internally by the measurement device, the arbitrary waveform generator being configured to output an output signal to be received by the device under test. The measurement device is therefore able to directly communicate with the device under test, both via the measurement channel input and the signal output. No external, separately formed unit is necessary for establishing the measurement system.

The device under test may be configured to forward further signals to the measurement channel input in response to a certain output signal received from the measurement device. Accordingly, a communication between the device under test and the measurement device is possible, for instance requests (input signals) transmitted to the measurement device and answers (output signals) received from the measurement device.

Embodiments of the present disclosure also provide a method for operating a measurement device. The method comprises the following steps:

receiving an input signal;

detecting a predetermined trigger event in the input signal;

generating an output signal appropriate for the trigger event detected; and outputting the output signal via an integrated arbitrary waveform generator output.

Therefore, by choosing the condition for detecting the trigger event (trigger condition), the measurement device can be adapted to automatically generate an output signal via the integrated arbitrary waveform generator in response to an input signal received fulfilling the respective condition.

In a certain embodiment of the present disclosure, the receiving step, the detecting step, the generating step, and the outputting step are performed by a single measurement device. Therefore, no additional signal generation device, such as an external function generator or an arbitrary waveform generator, is needed for generating the output signal. So the additional costs for the signal generation devices are saved and measurement setups can be arranged in a more compact way. In addition, the versatility of the measurement device is not impacted as an internal arbitrary waveform generator that is not connected to one of the outputs of the measurement device, in particular a trigger out output, that can be used for different purposes.

According to one aspect the input signal is digitized.

According to another aspect the method further comprises the steps of detecting at least one additional predetermined trigger event; and modifying the output signal based on the additional trigger event. The output signal may be modified in a way appropriate for the specific input signal received, for example if a device under test transmits different input signals and awaits the respective appropriate response signal.

A device under test may be provided, the device under test transmitting the input signal to be received by the measurement device, the integrated arbitrary waveform generator outputting the output signal to be received by the device under test. The measurement device is therefore able to directly communicate with the device under test, both via the measurement channel input and the signal output. Therefore, the measurement device can receive an input signal from the device under test, internally process the input signal, and then send the appropriate response output signal to the device under test without any device or unit being interconnected.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

DETAILED DESCRIPTION

The detailed description set forth below in connection with the appended drawings, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the claimed subject matter to the precise forms disclosed.

In the following description, numerous specific details are set forth in order to provide a thorough understanding of one or more embodiments of the present disclosure. It will be apparent to one skilled in the art, however, that many embodiments of the present disclosure may be practiced without some or all of the specific details. In some instances, well-known process steps have not been described in detail in order not to unnecessarily obscure various aspects of the present disclosure. Further, it will be appreciated that embodiments of the present disclosure may employ any combination of features described herein.

Figure 1:
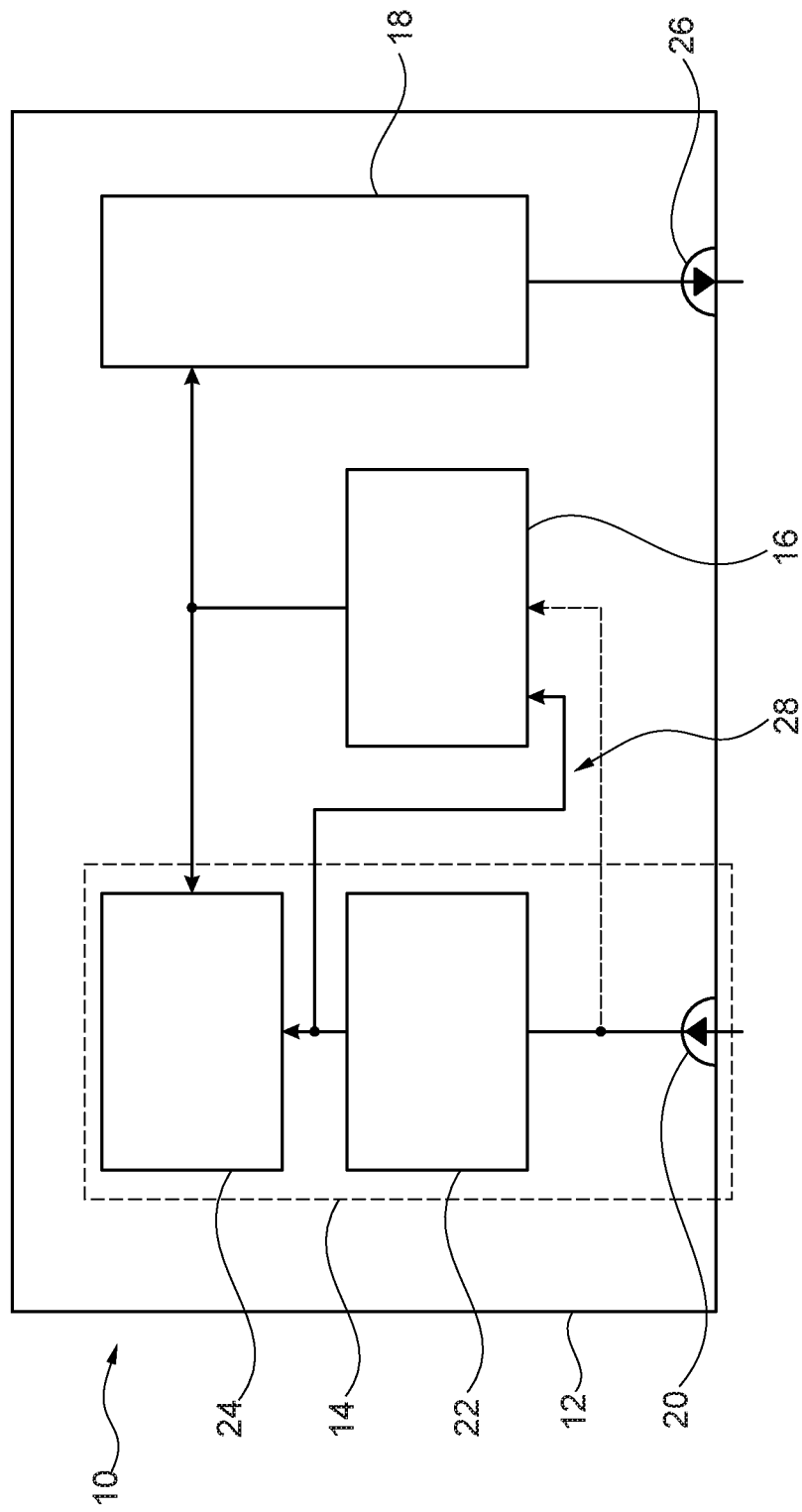
FIG. 1 shows a schematic overview of one representative embodiment of a measurement device according to the disclosure.

In FIG. 1, a measurement device 10 is shown that comprises a housing 12, a measurement channel 14, a trigger unit 16 connected to the measurement channel 14 and an arbitrary waveform generator 18 connected to both the measurement channel 14 and the trigger unit 16. The arrows in FIG. 1 depict the flow of data and/or signals within the measurement device 10.

The measurement channel 14, the trigger unit 16 and the arbitrary waveform generator 18 are all housed within the housing 12. Accordingly, the arbitrary waveform generator 18 is integrated in the measurement device 10 itself.

The measurement device 10 may be an oscilloscope, in particular an analog or a digital oscilloscope. Alternatively, the measurement device 10 may be a spectrum analyzer.

The measurement channel 14 comprises a measurement channel input 20, an analog to digital converter 22 connected to the measurement channel input 20 and an acquisition unit 24 connected to the analog to digital converter 22.

The trigger unit 16 is connected to both the measurement channel 14 and the arbitrary waveform generator 18. More precisely, if the trigger unit 16 is configured to receive and evaluate a digitized signal, i.e. if the trigger unit 16 is a digital trigger unit, the trigger unit 16 is connected to the analog to digital converter 22, in particular its output, the acquisition unit 24 as well as the arbitrary waveform generator 18. Accordingly, the trigger unit 16 receives a digital representative of the input signal inputted at the measurement channel input 20.

If the trigger unit 16 is configured to receive and evaluate an analog signal, i.e. if the trigger unit 16 is an analog trigger unit, the trigger unit 16 is connected to the measurement channel input 20 (depicted by the dashed line in FIG. 1), the acquisition unit 24 as well as the arbitrary waveform generator 18. The analog to digital converter 22 is optional in this embodiment.

The measurement device 10 may further comprise a signal output 26 allocated to the arbitrary waveform generator 18. Thus, the signal generated by the arbitrary waveform generator 18 may be outputted via the signal output 26.

The processing of the input signal received at the measurement channel input 20 will be described in the following for the embodiment shown in FIG. 1, in particular the one represented by the solid lines.

The analog to digital converter 22 is configured to receive an input signal, in particular an analog input signal, via the measurement channel input 20 and to generate a digital representative of the input signal, which will be called digitized input signal in the following. In other words, the analog to digital converter 22 is configured to digitize the input signal.

The acquisition unit 24 is configured to acquire the digitized input signal and to generate sampled output data by control of the trigger unit 16. In other words, besides time and voltage, the sampled output data contains additional information for every data point whether a certain trigger condition is met.

The acquisition unit 24 may be connected to an acquisition memory that is configured to store the sampled output data. The acquisition unit 24 may also be connected, possibly via the acquisition memory, to a display which is configured to graphically display the sampled output data.

The trigger unit 16 is configured to evaluate a signal processed by the measurement channel 14 in view of a predetermined trigger condition. In other words, the trigger unit 16 is configured to detect a predetermined trigger event in the signal processed by the measurement channel 14.

Depending on whether the trigger unit 16 is a digital or an analog trigger unit, the trigger unit 16 is configured to detect the predetermined trigger event in the input signal (dashed line) or in the digitized input signal (solid line). The measurement device 10 may comprise an interface that is configured to set the trigger condition appropriately. So, via the interface the trigger condition may be adjusted by a user of the measurement device 10.

The trigger unit 16 is configured to control the arbitrary waveform generator 18, in particular in view of a detected predetermined trigger event. More precisely, the trigger unit 16 causes the arbitrary waveform generator 18 to start generating an output signal provided that a predetermined trigger event was detected. This output signal may have a certain duration such that it stops automatically.

Otherwise, another predetermined event may cause the arbitrary waveform generator 18 to stop generating the output signal. Hence, the trigger unit 16 may discriminate at least between two different trigger events relating to starting and stopping the output signal.

Accordingly, the trigger unit 16 causes the arbitrary waveform generator 18 to start or stop generating the output signal on the basis of a predetermined trigger event detected in the signal processed by the measurement channel 14.

Moreover, the trigger unit 16 may cause the arbitrary waveform generator 18 to start generating an output signal with a delay from the predetermined trigger event detected. This ensures that the output signal generated may have a certain phase information such that repetitive measurements can be compared appropriately.

The trigger unit 16 may also be configured to cause the arbitrary waveform generator 18 to modify the output signal generated, in particular on the basis of a predetermined trigger event detected. Therefore, the output signal may be adapted to a signal awaited by a device under test connected to the measurement device 10.

As already discussed with regard to the starting and stopping, the trigger unit 16 is configured to discriminate between at least two trigger events. Furthermore, the trigger unit 16 may be configured to cause the arbitrary waveform generator 18 to modify the output signal generated in a certain manner, based on the specific trigger event detected. In other words, the trigger unit 16 may cause the arbitrary waveform generator to generate and output different output signals for different trigger events detected.

The measurement device 10 also comprises a bus system 28, the bus system 28 comprising all hardware and software relevant for transmission of data and/or signals within the measurement device 10. The trigger unit 16 may be configured to control the arbitrary waveform generator 18 based on data contained within the bus system 28, more specifically based on bus signals within the bus system 28. The measurement device 10 is configured to decode this data from the respective input signal being a bus signal.

In general, the output signal generated by the arbitrary waveform generator 18 is output via the signal output 26 allocated to the arbitrary waveform generator 18. Hence, the output signal generated internally is forwarded to the signal output 26 to be provided to an external device such as a device under test.

Figure 2:
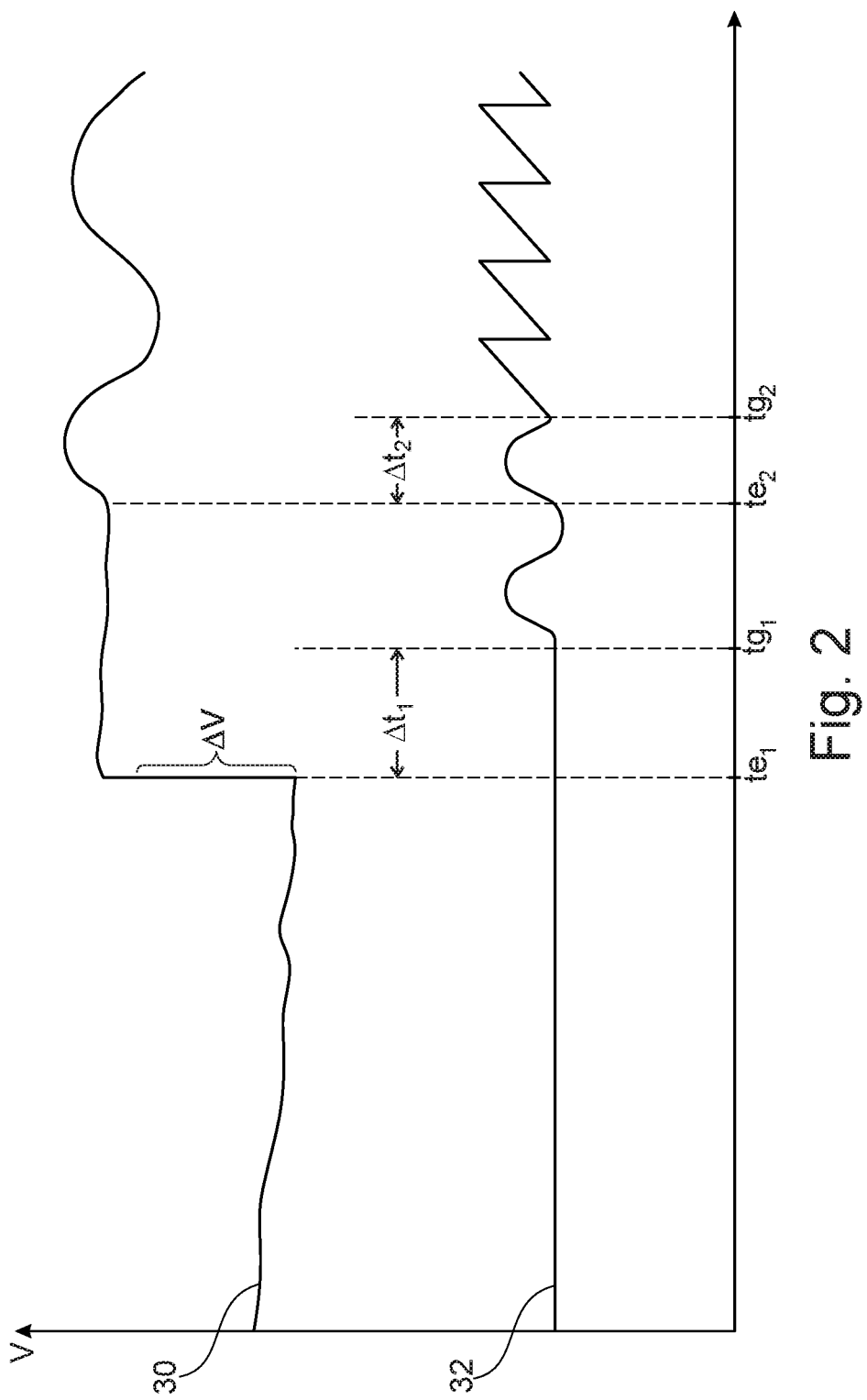
FIG. 2 shows an example of an input signal and an output signal.

FIG. 2 shows an example of an input signal and an output signal. The functionality of the measurement device 10 will be illustrated by reference to this example in the following. The input signal and output signal are plotted as a first graph 30 and a second graph 32 of voltage V over time t, respectively. For reasons of clarity, the first graph 30 and the second graph 32 are depicted with a voltage offset relative to each other.

At a time $t_{e1}$, a first trigger event is detected by the trigger unit 16. In the example shown in FIG. 2, a first trigger condition may be a rise of voltage of the input signal similar to a Heaviside step function by at least $\Delta V$. At a time $t_{g1}$, i.e. after a delay time $\Delta t_1$, the arbitrary waveform generator 18 starts generating and outputting an output signal by control of the trigger unit 16.

At a time $t_{e2}$, a second trigger event is detected b the trigger unit 16. In the example shown in FIG. 2, a second trigger condition may be that the input signal is sine-like with a certain frequency. In response to the second trigger event, the trigger unit 16 causes the arbitrary waveform generator to modify the output signal at a time $t_{g2}$, after a delay $\Delta t_2$.

As indicated in FIG. 2, the output signal generated may be modified with regard to trigger events detected in the same signal, but in different signal portions of the same signal.

Figure 3:
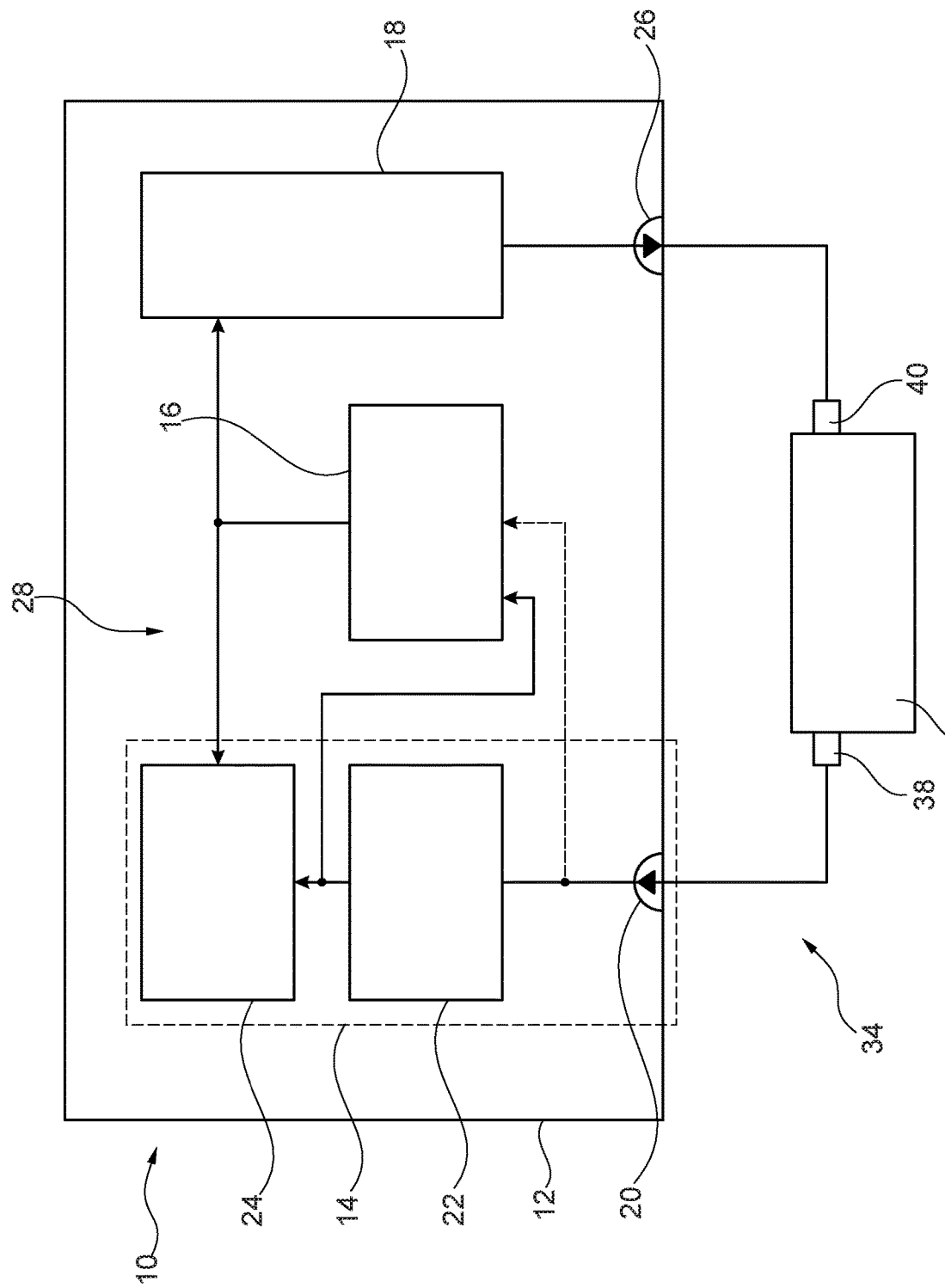
FIG. 3 shows schematic overview of one representative embodiment of a measurement system according to the disclosure.

FIG. 3 shows a measurement system 34 comprising the measurement device 10 and a device under test 36 connected to the measurement device 10. The arrows in FIG. 3 depict the flow of data and/or signals within the measurement device 10 as well as between the measurement device 10 and the device under test 36.

The device under test 36 is connected to the measurement channel input 20 of the measurement device 10. The device under test 36 may be connected to the measurement channel input 20 directly, via a cable or via a probe 38 of the measurement device 10 connected to the measurement channel input 20. The probe 38 may be configured to receive electromagnetic waves and to generate an input signal from the electromagnetic waves.

Moreover, the device under test 36 is connected to the signal output 26 allocated to the arbitrary waveform generator 18. The device under test 36 may be connected to the signal output 26 directly, via a cable or via a transmission unit 40 of the measurement device 10 connected to the measurement channel input 20. The transmission unit 40 may be configured to receive the output signal generated by the arbitrary waveform generator 18 and to generate electromagnetic waves from the output signal. These electromagnetic waves corresponding to the output signal are received and processed by the device under test 36 accordingly.

The device under test 36 is configured to forward a signal to the measurement channel input 20, possibly via the probe 38. The signal is processed by the measurement device 10 as described above. The arbitrary waveform generator 18 is configured to output an output signal via the signal output 26. The device under test 36 is configured to receive the output signal, possibly via the transmission unit 40.

The device under test 36 may be configured to forward further signals to the measurement channel input 20 in response to a certain output signal received from the measurement device 10.

Figure 4:
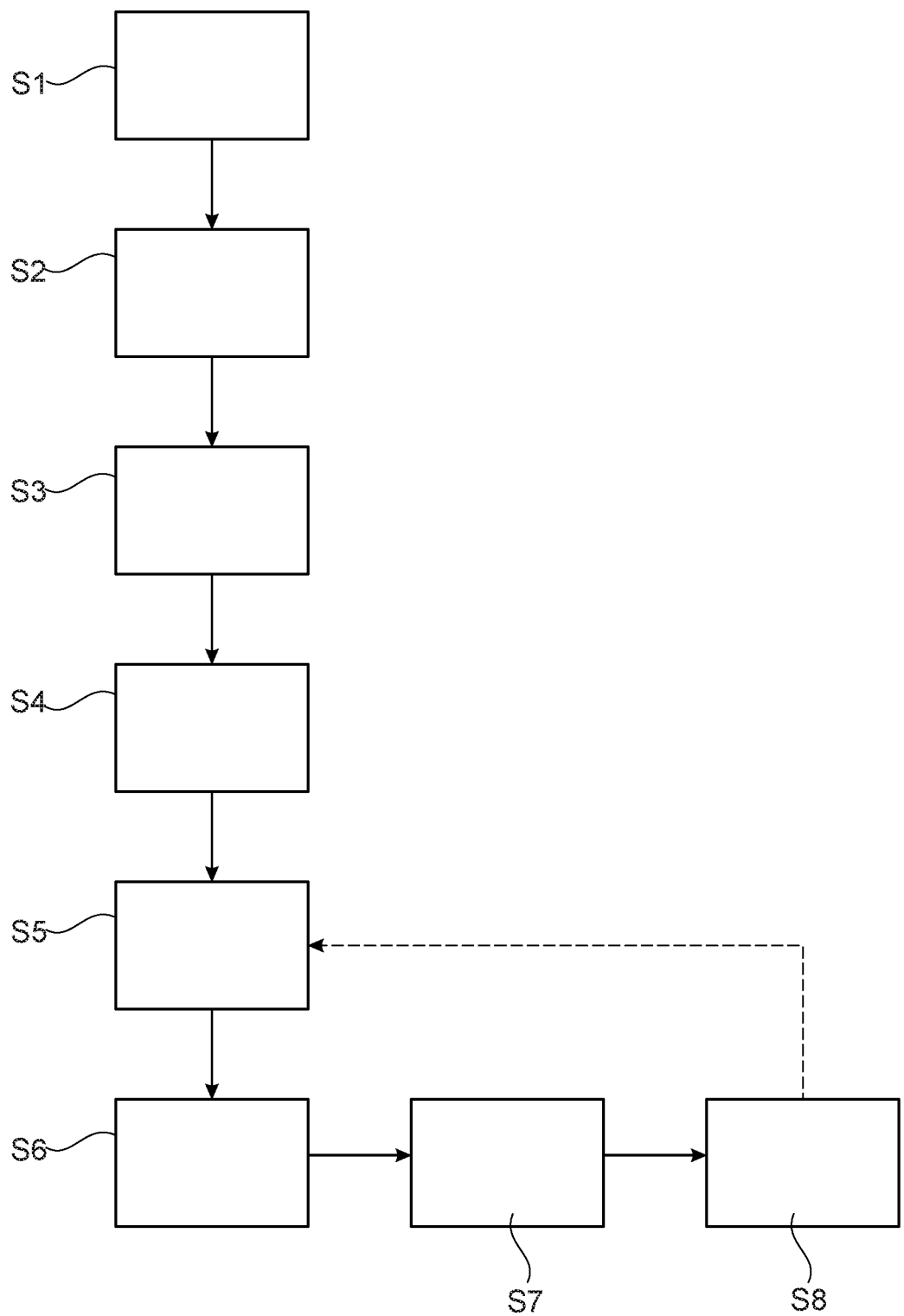
FIG. 4 shows a schematic flow chart of one embodiment of a method according to the disclosure.

A method for operating the measurement device 10 is illustrated in FIG. 4. In the following, the method will be elaborated on with reference to FIGS. 2 to 4.

First, an input signal generated by the device under test 36 is received (step S1) via the measurement channel input 20. While the input signal is processed by the measurement channel 14, a predetermined trigger event is detected (step S2) in the input signal by the trigger unit 16. The predetermined trigger event may be detected in the input signal if the trigger unit 16 is an analog trigger unit and in the digitized input signal if the trigger unit 16 is a digital trigger unit.

If a trigger event is detected, an output signal appropriate for the trigger event is generated (step S3). An appropriate output signal means that the output signal generated is a signal that the device under test 36 awaits in response to the input signal generated by the device under test 36.

Generally, the output signal generated simulates the signal of a tag, for instance a NFC tag. Accordingly, the measurement device 10 is configured to simulate the signal of a tag.

The output signal generated is then output via the signal output 26 (step S4) allocated to the arbitrary waveform generator 18, wherein the arbitrary waveform generator 18 is integral to the measurement device 10. Accordingly, the arbitrary waveform generator 18 is housed within the housing 12 of the measurement device 10 such that an integral arbitrary waveform generator 18 is provided.

The output signal generated internally is received by the device under test 36 connected to the measurement device 10. If the output signal is appropriate (in the sense explained above) for the input signal generated, the device under test 36 may generate and transmit a second input signal, which may differ from the first input signal.

The second input signal is then received via the measurement channel input 20 (step S5) and processed by the measurement channel 14. While the second input signal is processed by the measurement channel 14, a second predetermined trigger event may be detected (step S6) in the second input signal by the trigger unit 16. The second predetermined trigger event may differ from the first predetermined trigger event.

If a second trigger event is detected, the output signal may be modified (step S7) compared to the first output signal generated in response to the first input signal. The modified signal may be generated in a way being appropriate for the second trigger event detected and output (step S8) afterwards.

As shown in FIG. 2, the output signal generated may also be modified while outputting the output signal which means without any stopping.

The cycle of receiving a signal, detecting a certain trigger event and generating an output signal may repeat several times (as indicated by the dashed arrow in FIG. 4), wherein trigger events, signals received and output signals generated may differ from each other, respectively.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

The embodiments of the invention in which an exclusive property or privilege is claimed are defined as follows:

1. A measurement device, comprising:
 a housing;
 a measurement channel;
 a trigger unit connected to said measurement channel; and
 an arbitrary waveform generator housed within said housing,
 said measurement channel comprising an acquisition unit;
 said trigger unit being configured to detect a predetermined trigger event in a signal processed by said measurement channel;
 said trigger unit being configured to control said acquisition unit; and
 said trigger unit being configured to control said arbitrary waveform generator,
 wherein said trigger unit is configured to cause said arbitrary waveform generator to start generating an output signal, and
 wherein said trigger unit is configured to cause said arbitrary waveform generator to stop generating the output signal,
 wherein said measurement device is connectable to a device under test, and
 wherein said device under test is configured to forward a signal to an input of said measurement device, said signal being processed internally by said measurement device, said arbitrary waveform generator being configured to output said generated output signal to be received by said device under test.

2. The measurement device according to claim 1, wherein said trigger unit is configured to cause said arbitrary waveform generator to start generating said output signal with a delay.

3. The measurement device according to claim 1, wherein said trigger unit is configured to cause said arbitrary waveform generator to modify the output signal generated.

4. The measurement device according to claim 1, wherein said trigger unit is an analog trigger unit, said analog trigger unit being connected to the input of said measurement device.

5. The measurement device according to claim 1, wherein said trigger unit is a digital trigger unit, said digital trigger unit being configured to receive a digital representative of an input signal.

6. The measurement device according to claim 1, wherein said measurement device further comprises a bus system, said trigger unit being configured to control said arbitrary waveform generator based on data contained within a bus signal.

7. The measurement device according to claim 1, wherein said measurement device further comprises a signal output allocated to said arbitrary waveform generator.

8. The measurement device according to claim 1, wherein said trigger unit is configured to discriminate between at least two different trigger events.

9. The measurement device according to claim 8, wherein said trigger unit is configured to cause said arbitrary waveform generator to modify said output signal based on which of the at least two different trigger events is detected.

10. The measurement device according to claim 1, wherein said measurement device comprises an interface that is configured to set said predetermined trigger event.

11. The measurement device according to claim 1, wherein said measurement device is at least one of an oscilloscope and a spectrum analyzer.

12. The measurement device according to claim 1, wherein said trigger unit is configured to detect said predetermined trigger event and to control said arbitrary waveform generator in response to said predetermined trigger event detected.

13. Measurement system comprising a device under test and a measurement device according to claim 1, said device under test and said measurement device being connected with each other.

14. Measurement system according to claim 13, wherein the device under test is configured to forward further signals to the measurement channel input in response to a certain output signal received from said measurement device.

15. A method for operating a measurement device, comprising the steps of:
 receiving an input signal;
 detecting at least one predetermined trigger event in said input signal;
 generating an output signal appropriate for said at least one predetermined trigger event detected; and
 outputting said output signal via an integrated arbitrary waveform generator output,
 wherein an integrated arbitrary waveform generator is controlled to start outputting said output signal based on said at least one predetermined trigger event, and
 wherein said integrated arbitrary waveform generator is controlled to stop outputting said output signal based on said at least one predetermined trigger event,
 wherein a device under test is provided, said device under test transmitting said input signal to be received by said measurement device, said integrated arbitrary waveform generator outputting said output signal to be received by said device under test.

16. The method according to claim 15, wherein said receiving step, said detecting step, said generating step, and said outputting step are performed by a single measurement device.

17. The method according to claim 15, wherein the method further comprises the steps of:
 detecting at least one additional predetermined trigger event; and
 modifying said output signal based on said additional predetermined trigger event.

* * * * *